(12) United States Patent
Takshi et al.

(10) Patent No.: US 7,649,217 B2
(45) Date of Patent: Jan. 19, 2010

(54) THIN FILM FIELD EFFECT TRANSISTORS HAVING SCHOTTKY GATE-CHANNEL JUNCTIONS

(76) Inventors: Arash Takshi, 5609 Presidents Row, Vancouver, BC (CA) V6T 1L5; John Madden, 3958 West 17th Avenue, Vancouver, BC (CA) V6S 1A5

( * ) Notice: Subject to any disclaimer, the term of this patent is extended or adjusted under 35 U.S.C. 154(b) by 337 days.

(21) Appl. No.: 11/909,715

(22) PCT Filed: Mar. 24, 2006

(86) PCT No.: PCT/CA2006/000445

§ 371 (c)(1),
(2), (4) Date: Sep. 25, 2007

(87) PCT Pub. No.: WO2006/099744

PCT Pub. Date: Sep. 28, 2006

(65) Prior Publication Data

US 2008/0258137 A1   Oct. 23, 2008

Related U.S. Application Data

(60) Provisional application No. 60/664,966, filed on Mar. 25, 2005.

(51) Int. Cl.
*H01L 29/80* (2006.01)
(52) U.S. Cl. .................. 257/260; 257/40; 257/280; 257/401; 257/E51.005; 257/E51.009
(58) Field of Classification Search .............. 257/260, 257/40, 280, 401, E51.005, E51.009
See application file for complete search history.

(56) References Cited

U.S. PATENT DOCUMENTS 5,362,975 A   11/1994   von Windheim et al.

(Continued)

FOREIGN PATENT DOCUMENTS

EP   0275075   7/1988

(Continued)

OTHER PUBLICATIONS

G. Horowitz, Organic Field-Effect Transistors, Adv. Mater. 1998, 10, No. 5, pp. 365-377.

(Continued)

*Primary Examiner*—Tu-Tu V Ho
(74) *Attorney, Agent, or Firm*—Oyen Wiggs Green & Mutala LLP (57) ABSTRACT

An active electronic device has drain and source electrodes that make ohmic conduct with a layer of a semiconductor. The semiconductor layer may be a thin layer of an organic or amorphous semiconductor. The drain and source electrodes are on a first face of the layer of semiconductor at locations that are spaced apart on either side of a channel. The device has a gate electrode on a second face of the layer of semiconductor adjacent to the channel. The gate electrode makes a Schottky contact with the semiconductor to produce a depletion region in the channel. The gate electrode may encapsulate the channel so that the channel is protected from contact with oxygen, water molecules or other materials in the environment. In some embodiments, the device has an additional gate electrode separated from the semiconductor layer by an insulating layer. Such embodiments combine features of OFETs and MESFETs.

28 Claims, 4 Drawing Sheets

U.S. PATENT DOCUMENTS

| | | | |
|---|---|---|---|
| 5,705,826 | A | 1/1998 | Aratani et al. |
| 6,603,141 | B2 | 8/2003 | Lach et al. |
| 6,630,382 | B1 | 10/2003 | Thornton |
| 6,815,711 | B2 | 11/2004 | Geens et al. |
| 7,002,176 | B2 * | 2/2006 | Iechi et al. ............... 257/40 |
| 2001/0045798 | A1 | 11/2001 | Christensen |
| 2004/0004215 | A1 | 1/2004 | Iechi et al. |
| 2004/0018669 | A1 | 1/2004 | Song |
| 2004/0061141 | A1 | 4/2004 | Kondoh |
| 2004/0155992 | A1 | 8/2004 | Choi |

FOREIGN PATENT DOCUMENTS

| | | |
|---|---|---|
| EP | 1478212 | 11/2004 |
| WO | 03065466 | 8/2003 |
| WO | 2004061906 | 7/2004 |

OTHER PUBLICATIONS

J.H. Schon, C. Kloc, Organic metal-semiconductor field-effect phototransistors, Appl.Phys. Lett vol. 78, No. 22, May 2001, pp. 3538-3540.

Li, Flora et al., Dual-gate SiO2/P3HT/SiNx organic TFT. Mar. 28-Apr. 1, 2005 MRS Proc: Organic Electronics, p. I9.3, San Francisco.

Glenick, G.H. et al., Dual-gate organic thin-film transistors, Applied Physics Letters, 87, 073508, Aug. 10, 2005.

Cui, Tianhong et al., Dual-gate pentacene organic field-effect transistors based on a nanoassembled SiO2 nanoparticle thin film as the gate dielectric layer, Applied Physics Letters, 86, 064102, Feb. 1, 2005.

International Search Report for PCT/CA2006/000445, International Searching Authority, Jun. 5, 2006, pp. 1-4.

Narasimhan et al., "Junction devices based on sulfonated polyaniline", Applied Physics Letters, vol. 72, No. 9, pp. 1063-1065, Mar. 2, 1998.

Ohmori et al., "Fabrication and Characteristics of Schottky Gated Poly(3-alkylthiophene) Field Effect Transistors", Japanese Journal of Applied Physics, vol. 30, No. 4A, pp. L610-L611, Apr. 1991.

* cited by examiner

FIGURE 2D

THIN FILM FIELD EFFECT TRANSISTORS HAVING SCHOTTKY GATE-CHANNEL JUNCTIONS

CROSS-REFERENCE TO RELATED APPLICATION

This application claims priority from and, for the purpose of the United States of America, claims the benefit under 35 U.S.C. §119 of U.S. application No. 60/664,966 filed 25 Mar. 2005 and entitled SELF ENCAPSULATING METAL SEMICONDUCTOR FIELD EFFECT TRANSISTOR which is hereby incorporated herein in its entirety.

TECHNICAL FIELD

The invention relates to field effect transistors. The invention has application, for example, in field effect transistors based on organic or amorphous semiconductors.

BACKGROUND

Devices based on organic semiconductors can be inexpensive to fabricate. Such devices have promise for making very inexpensive electronic products. Organic devices have particular advantages over conventional silicon-based devices in large area devices (e.g. displays) or in moderate quantities (where the economies of scale offered by silicon fabrication are not available).

Many organic semiconductors are soluble in organic solvents. It is possible to deposit thin films of such materials (typically less than 1 μm in thickness) by various methods such as spin coating, inkjet printing, and micro stamping. Other organic semiconductors can be deposited by thermal evaporation in vacuum or single crystal growth methods.

Transistors are important components in various electronic circuits and integrated circuits. The Thin Film Transistor (TFT) structure is a common structure for making transistors that incorporate organic semiconductors. A TFT is a type of Isolated Gate Field Effect Transistor (IGFET) and its structure is very similar to that of a Metal Oxide Semiconductor Field Effect Transistor (MOSFET). A TFT made of organic semiconductors is usually called an Organic FET or OFET.

Figure 1:
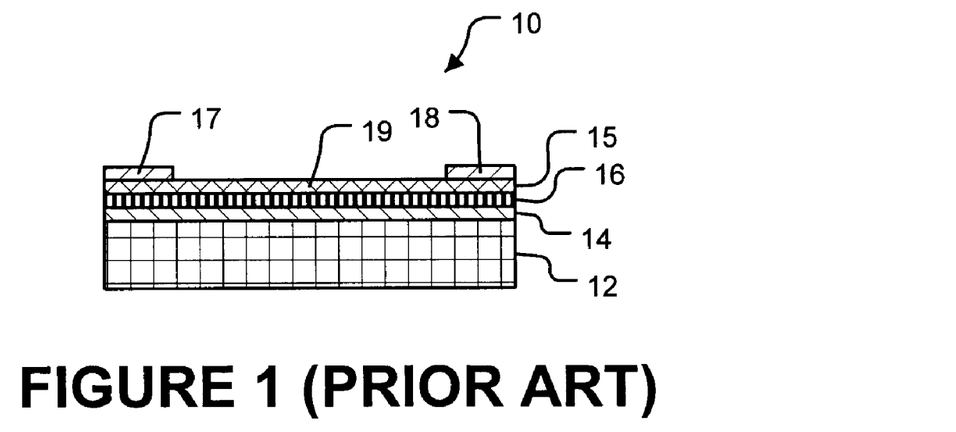
FIG. 1 is a schematic cross sectional view of a prior art organic field effect transistor.
Figure 1A:
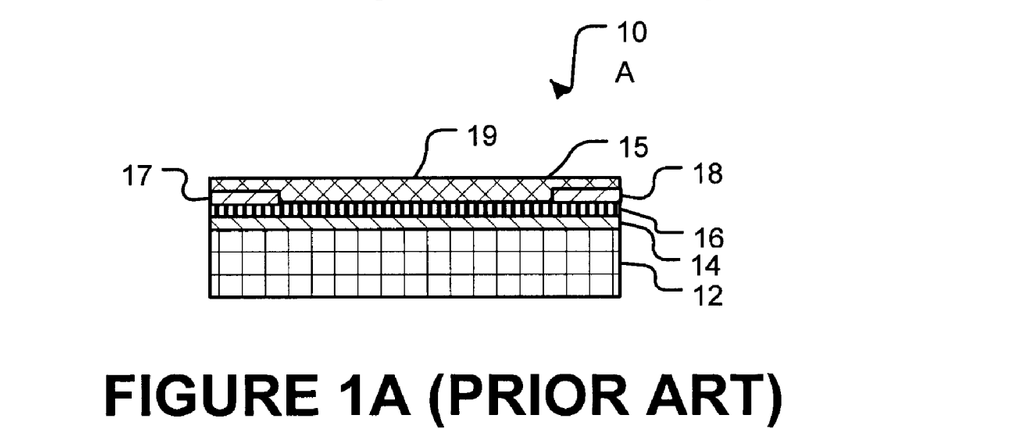
FIG. 1A is a schematic cross sectional view of another prior art organic field effect transistor.

FIG. 1 shows an OFET 10. OFET 10 is formed on a substrate 12 and comprises a gate electrode 14 separated from a semiconductor 15 by an insulating layer 16. Source and drain electrodes 17 and 18 are deposited on either side of a channel 19 in semiconductor 15. FIG. 1A shows an alternative OFET 10A which differ from OFET 10 primarily in that source 17 and drain 18 lie under semiconductor 15.

Since the mobility of one type of carrier (electron or hole) in organic semiconductors is usually much higher than the other, organic semiconductor devices can generally be considered to be single-carrier devices. OFETs typically work either in accumulation or depletion modes.

If applying a voltage to the gate causes accumulation of carriers at the semiconductor/insulator interface, the conductance between the drain and the source increases, which is referred to as the accumulation mode. In order to decrease the channel conductance the opposite voltage can be applied to the gate to repel carriers not only from the semiconductor/insulator interface but also from the bulk of the semiconductor. Switching between accumulation and depletion modes can be used in digital logic applications. OFETs produced by simple deposition methods such as inkjet printing and stamping have shown very poor molecular order at the semiconductor/insulator interface. Such OFETs have suffered from poor performance in accumulation mode, presumably because they exhibit very poor molecular order at the semiconductor/insulator interface. Poor molecular order results in low carrier mobility. OFETs that provide improved performance have been made by growing single crystals of small semiconductor organic molecules. However, single crystal growth is a very expensive fabrication method, which substantially increases the final product price.

Another problem with current OFETs is that switching a typical OFET from the accumulation mode to the depletion mode needs a large change in the gate voltage (usually more than 40 volts). The reason that such a wide range of voltage is needed relates to the conductivity of the bulk semiconductor at subthreshold voltages. In order to reduce the conductivity of the channel in the depletion mode, carriers have to be removed from the bulk semiconductor. This can be done by applying a voltage across the semiconductor. However a significant amount of the applied gate voltage is dropped across insulator 16. Because insulating layer 16 usually has a much smaller unit capacitance than does semiconductor 15, a relatively small electric field is present in the bulk of semiconductor 15 to push away the carriers.

The required gate voltage can be reduced by making insulating layer 16 thinner or by making insulating layer 16 of a high dielectric material. Both of these solutions greatly increase the cost of fabricating the OFET because they require advanced and complicated fabrication processes.

Another prior art device is a Metal Semiconductor Field Effect Transistor (MESFET). A MESFET works only in the depletion mode. The behavior of OFETs in the depletion mode can be modeled as a MESFET with an interfacial layer between gate and semiconductor: G. Horowitz, *Organic Field-Effect Transistors*, Adv. Mater 1998, 10, No. 5, pp. 365-377. It is known in the art that organic MESFETs provide inferior performance.

Figure 1B:
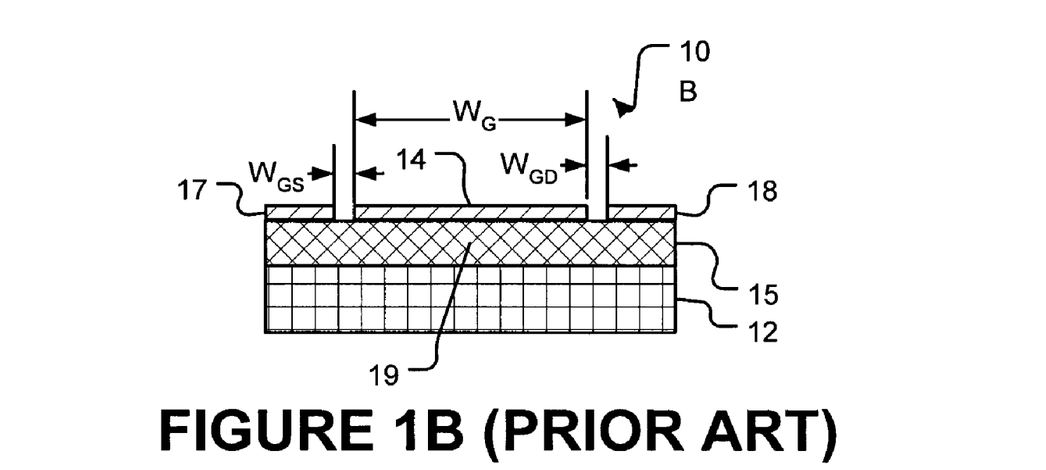
FIG. 1B is a schematic cross sectional view of a prior art metal semiconductor field effect transistor.

MESFETs based upon crystalline semiconductors, such as GaAs, are well known. FIG. 1B shows the structure of a conventional MESFET. A semiconductor 15 is located on top of an insulating substrate 12. Source 17 and drain 18 electrodes make Ohmic contacts to semiconductor 15. A gate electrode 14 is made from a material which can produce a Schottky contact with semiconductor 15. Since the gate is located between drain 17 and source 18, changing the voltage between gate 14 and source 17 can change the width of the depletion region produced by the Schottky contact. This changes the cross section of the conductive channel 19 between drain 17 and source 18. Consequently, modulating the gate-source voltage can modulate the drain current.

Since there is no insulating layer between gate and the semiconductor in the MESFET the gate voltage directly drops across the semiconductor, and so a smaller gate voltage is required in the MESFET in the depletion mode as compared to the OFET. Another advantage of the MESFET structure is that the characteristics of the transistor depend on the bulk properties of the semiconductor rather than the molecular structure of the interface with the gate.

MESFETs based on organic semiconductors are described in:

J. H. Schon, C. Kloc, *Organic metal-semiconductor field-effect phototransistors*, Appl. Phys. Lett. Vol. 78, No. 22, May 2001, pp. 3538-3540;

Lach et al., U.S. Pat. No. 6,603,141; and

Christensen, US patent application 2001/0045798.

A significant problem MESFETs based on organic/amorphous semiconductors is low transconductance and low conductance relative to transistors having the TFT structure. One of the effective parameters in conductance and transconductance is the channel length. Since in the conventional MESFET the gate is located between the drain and the source contacts, the channel length is equal to the sum of gate length, $W_G$, the gap $W_{GS}$ between the gate and the source and the gap $W_{GD}$ between the gate and the drain.

Patents and applications that relate to transistors similar to those described above include:

U.S. Pat. No. 6,815,711 B2
U.S. Pat. No. 6,603,141 B2
US 2004/0061141 A1
US 2004/0155992 A1
US 2004/0018669 A1
US 2001/0045798 A1
EP 0 275 075 A2
EP 1 478 212 A1
WO 03/065466 and,
WO 2004/061906.

There is a need for transistors that can be fabricated inexpensively and yet offer performance acceptable for various applications.

SUMMARY OF THE INVENTION

This invention provides active electronic devices comprising drain and source electrodes that make ohmic contact with a layer of a semiconductor. The drain and source electrodes are on a first face of the layer of semiconductor at locations that are spaced apart on either side of a channel in the layer of semiconductor. The devices also comprise a gate electrode on a second face of the layer of semiconductor adjacent to the channel. The gate electrode makes a Schottky contact with the layer of semiconductor to produce a depletion region in the channel.

The invention also provides electrical devices that include such active electronic devices and methods for making active semiconductor devices.

Further aspects of the invention and features of specific embodiments of the invention are described below.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 2:
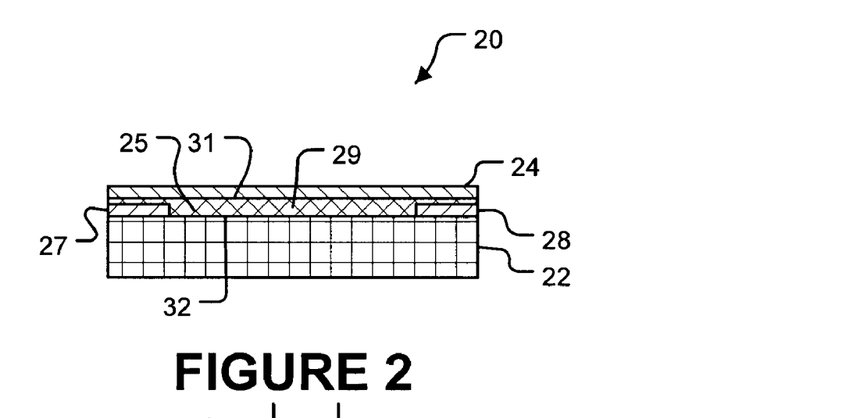
FIG. 2 is a schematic cross sectional view of a transistor according to one embodiment of the invention.

FIG. 2 shows a transistor 20 according to an embodiment of the invention. Transistor 20 has a layer 25 of a semiconductor on a substrate 22. A gate 24 is on a 25 first side 31 of semiconductor layer 25. Gate 24 forms a Schottky contact with the material of semiconductor layer 25.

A source electrode 27 and a drain electrode 28 are each in ohmic contact with semiconductor layer 25. Source electrode 27 and drain electrode 28 are separated from gate 24 by the material of layer 25. In the illustrated embodiment, source electrode 27 and drain electrode 28 are on a second side 32 of semiconductor layer 25 opposed to first side 31. In the illustrated embodiment, source electrode 27 and drain electrode 28 are on substrate 22. A channel 29 extends through semiconductor layer 25 between source electrode 27 and drain electrode 28.

Gate electrode 24 substantially covers channel 29. In the illustrated embodiment, gate electrode 24 also covers source electrode 27 and drain electrode 28. Since gate 24 does not lie between source electrode 27 and drain electrode 28 channel 29 may be made very short, if desired. Decreasing the length of channel 29 tends to cause transconductance to increase. In general, channel 29 should be kept longer than the thickness of layer 25 to avoid the "short channel effect". For example, channel 29 may be 5 or more times longer than layer 25 is thick. In an example embodiment, layer 25 has a thickness of about 100 nm and channel 19 has a length of about 800 nm. This length is determined by the separation between source electrode 27 and drain electrode 28.

Figure 3:
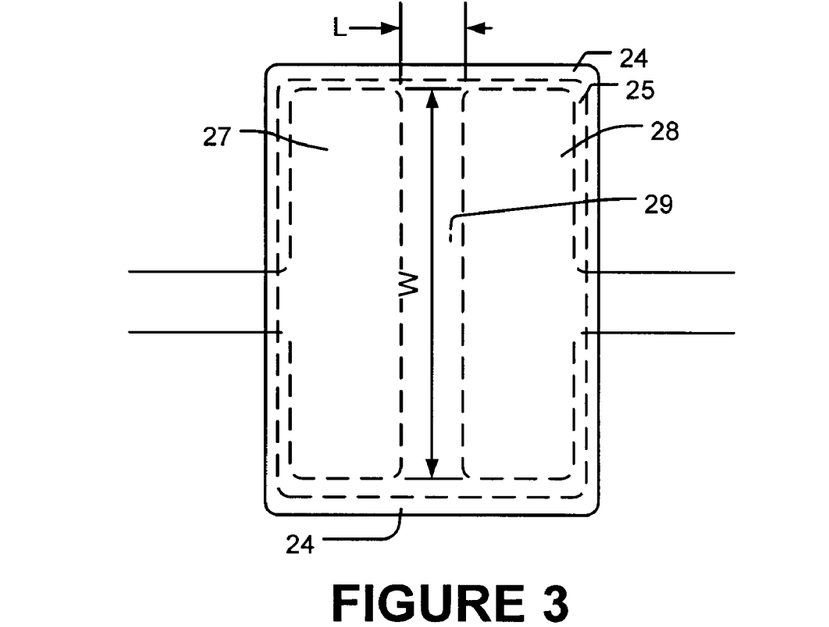
FIG. 3 is a schematic top plan view of one or many possible configurations for the transistor of FIG. 2; and, FIG. 4 is a plan view of the transistor of FIG. 2B.
Figure 4:
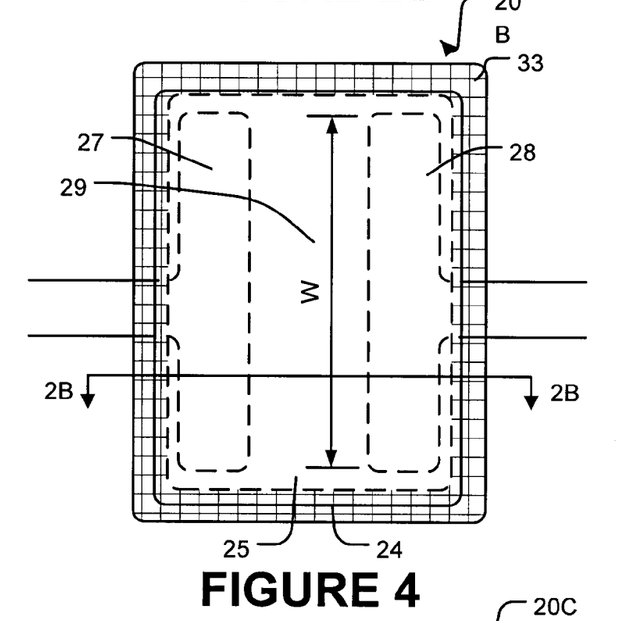

Transistor 20 may have any of a wide variety of configurations. FIG. 3 shows one possible configuration. In general, the width W of channel 29 may be chosen to provide a desired conductivity. A transistor 20 may require a channel that is substantially wider than the channel of a comparable OFET to provide the same conductivity as the comparable OFET. Some simulations, that have been done with poly 3hexylthiophene as the semiconductor, indicate that channel 29 should have a width approximately twenty times wider than the width of the channel in a comparable OFET to provide the same current-carrying capacity.

Semiconductor layer 25 may comprise any suitable semiconductor. Layer 25 may be an n-type material or a p-type material. In preferred embodiments, semiconductor layer 25 is one or both of amorphous and organic. Suitable organic semiconductors include semiconducting organic polymers, oligomers, and small-molecule organic semiconductors. Some non-limiting examples of organic semiconductors that may be used to provide layer 25 are:

Pentacene
Regioregular poly(3 hexylthiophene) (rr-P3HT)
other regioregular poly(3-alkylthiophene)s Most suitable organic semiconductors tend to be p-type semiconductor materials.

Layer 25 is preferably thin, at least in channel 19. For example, layer 25 may have a thickness that is 1 μm or less. In some embodiments, layer 25 has a thickness in the range of 30 nm to 400 nm, such as approximately 100 nm. The thickness of layer 25 will affect the behavior of transistor 20. If layer 25 is thick enough that, at zero applied gate voltage, the depletion region does not extend all of the way through layer 25 in channel 19 then transistor 20 will operate in the same manner as a depletion MESFET. If layer 25 is so thin that, at zero applied gate voltage, the depletion region extends all of the way through layer 25 in channel 19 then transistor 20 will operate in the same manner as an enhancement MESFET.

Simulations show that for the Schottky junction between rr-P3HT and an aluminum gate electrode, the depletion region has a thickness of approximately 70 nm with zero applied gate voltage. In this example case, for a transistor 20 to function as a depletion device, the thickness of layer 25 should exceed 70 nm and for the transistor 20 to function as an enhancement device the thickness of layer 25 should be less than 70 nm, for example, 50 nm.

Some non-limiting examples of inorganic amorphous semiconductors that may be used to provide layer 25 are:
- amorphous silicon;
- amorphous CdS;
- amorphous CdSe;
- amorphous C—Si; and,
- amorphous GaAs.

Substrate 22 may be any material capable of supporting transistor 20. For some applications, substrate 22 may advantageously be somewhat flexible. For example, substrate 22 may comprise a sheet of a plastic material of the type that may be used to make credit cards, identification cards and the like. For other applications, substrate 22 may be more rigid or more flexible.

Source and drain electrodes 27 and 28 may be of any material or materials that provide a substantially ohmic contact with the semiconductor material of layer 25. Suitable materials may be chosen from metals, carbon nanotubes, suitable doped semiconductors, and electrically-conducting polymers. Which materials are most suitable for source and drain electrodes 27 and 28 depends upon whether semiconductor layer 25 is of an n-type semiconductor or a p-type semiconductor.

Where the semiconductor is a p-type semiconductor, source and drain electrodes 27 and 28 may be of a metal having a high work function. Some examples of such metals that also have other desirable properties are gold and platinum. Where the semiconductor is an n-type semiconductor, then the material of source and drain electrodes 27 and 28 should have a relatively low work function to provide an ohmic contact with the semiconductor material of layer 25.

The material of gate electrode 24 should provide a Schottky contact with the semiconductor material of layer 25. Where the semiconductor is an p-type semiconductor, then a metal having a low work function may be used for gate 24. For example, gate 24 may comprise a layer of silver, calcium, cesium, magnesium or aluminum. In some embodiments, the gate electrode is of a material having a work function not exceeding 3½ eV.

Although cesium and calcium have low work functions, their reactivity may be a disadvantage in some applications. Also, small calcium ions may tend to diffuse into some organic semiconductors. Therefore, in certain applications, aluminum may be preferable to calcium, cesium or magnesium. A suitable electrically-conducting polymer that has a low work function may also be used for gate electrode 24.

Preferably gate electrode 24 is substantially impermeable to oxygen and water such that gate electrode 24 protects channel 29 from contact with oxygen or water from the environment.

In one example embodiment, transistor 20 is made with source and drain electrodes 27 and 28 made of platinum, a semiconductor layer made of pentacene, and a gate electrode made of cesium.

In another example embodiment of the invention, transistor 20 is made with source and drain electrodes 27 and 28 made of a conducting polymer such as Poly(3,4-ethylenedioxythiophene) poly(styrenesulfonate) also known as PEDOT and available under the brand name Baytron-P™ from Bayer AG, a semiconductor layer 25 pentacene, and a gate electrode made of a conducting polymer that has been chemically reduced so that it has a diminished work function.

Any suitable methods may be used to fabricate a transistor 20 as shown in FIG. 2. For example, source and drain electrodes 26 and 27 may be fabricated by any of:
- lithography,
- shadow masking,
- electrodeposition,
- etching,
- ion beam milling,
- stamping,
- inkjet printing, or
- the like.

Semiconductor layer 25 may be applied by any of a wide variety of techniques of which the following are non-limiting examples:
- lithography,
- electrodeposition,
- inkjet printing,
- stamping,
- shadow masking
- spin coating,
- dip coating,
- micro contact printing,
- spraying,
- vapor deposition,
- single crystal growth methods,
- roll-to-roll printing,
- laser ablation,
- sputtering, or
- the like.

Semiconductor 25 may be deposited in one step and then patterned subsequently or deposited in a desired pattern.

Gate electrode 24 may be formed by any suitable techniques such as:
- lithography,
- shadow masking,
- electrodeposition,
- stamping,
- inkjet printing, or
- the like.

In an example fabrication method, source and gate electrodes 27 and 28 (as well as suitable interconnections) are formed on a substrate 22 by any suitable method. Then semiconductor layer 25 is deposited by an appropriate method. Finally, gate electrode 24 is deposited. In depositing gate electrodes 24 one should avoid the use of solvents that could deleteriously affect semiconductor layer 25. Shadow masking is one method that may be used to deposit gate electrodes 24 without the use of solvents.

It is notable that the resolution of the techniques by which semiconductor layer 25 and gate electrode 24 are patterned may be significantly lower than that of the technique by which source and drain electrodes 27 and 28 are patterned. Further, since gate electrode 24 can overlap with source and drain electrodes 27 and 28, it is not critical to maintain precise alignment of gate electrode 24 with underlying structures. The dimensions of channel 19 are defined primarily by the geometry of source and drain electrodes 27, 28. Further, since gate electrode 24 can overlap with source and drain electrodes 27 and 28, it is not critical to maintain precise alignment of gate electrode 24 with underlying structures.

It can be appreciated that the transistor of FIG. 2 has a number of features that may be advantageous in particular applications. These include:

Gate 24 protects channel 19 from contamination by oxygen, water, or other chemicals that may be present in the environment surrounding transistor 20.

Because gate 24 encapsulates channel 19, no additional passive layer is needed to protect channel 19. This reduces fabrication costs.

Since gate 24 is located at a different level from drain and source electrodes 27 and 28, the length, L (See FIG. 3) of channel 19 can be made to be as small as the gap between drain and the source electrodes 27, 28. Hence it is possible to fabricate a transistor like that shown in FIG. 2 in which channel 19 is as short as the minimum feature size provided by whatever method is used to pattern drain and source electrodes 27 and 28. This enhances the conductance and transconductance of the fabricated transistors 20.

Since transistor 20 can operate entirely in depletion mode, there is no need for the semiconductor to have a particularly high degree of order at the semiconductor/gate interface. Thus low-cost methods such as spin coating may be used to deposit semiconductor layer 25.

The lack of an insulating layer in transistor 20 reduces the number of steps in its production as compared to a comparable OFET design. This reduces the fabrication cost compared to the OFET.

If gate electrode 24 and source and drain electrodes 27 and 28 are all made of suitable electrically conducting polymers then the transistor and even an entire electrical circuit that includes the transistor may be made without metal and through the use of low-cost fabrication techniques such as inkjet printing.

Figure 2A:
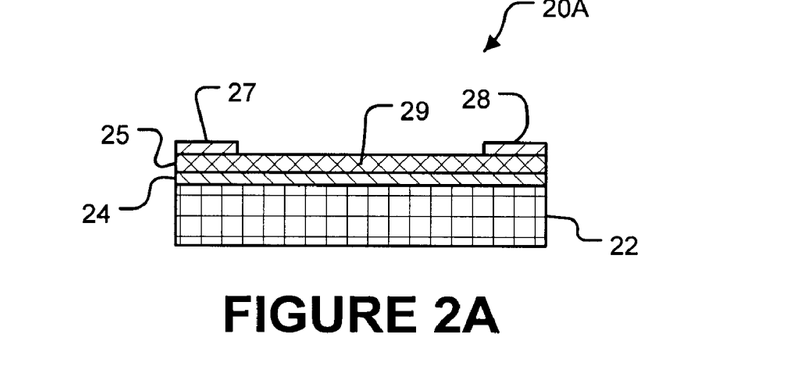
FIG. 2A is a schematic cross sectional view of a transistor according to an alternative embodiment of the invention.

FIG. 2A shows a transistor 20A that is similar to transistor 20 of FIG. 2 except that the gate 24 is located on the same side of semiconductor layer 25 as substrate 22 while source and drain electrodes 27 and 28 are located on the opposing side of semiconductor layer 25. Transistor 20A has the disadvantage relative to transistor 20 that gate 24 does not encapsulate channel 19.

Figure 2B:
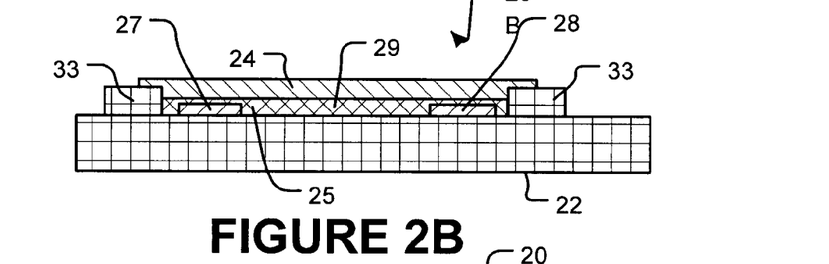
FIG. 2B is a schematic cross sectional view of a transistor according to another alternative embodiment of the invention.

FIG. 2B shows a transistor 20B that is similar to transistor 20 except that it is surrounded by an insulating barrier 33. Barrier 33 prevents oxygen and other contaminants from diffusing into channel 19 from edges of the transistor 20. Gate electrode 24 overlaps with insulating barrier 33 to protect semiconductor layer 25 from any contamination. Barrier 33 may also insulate transistor 20B from other transistors or other electronic devices on substrate 22.

Figure 2C:
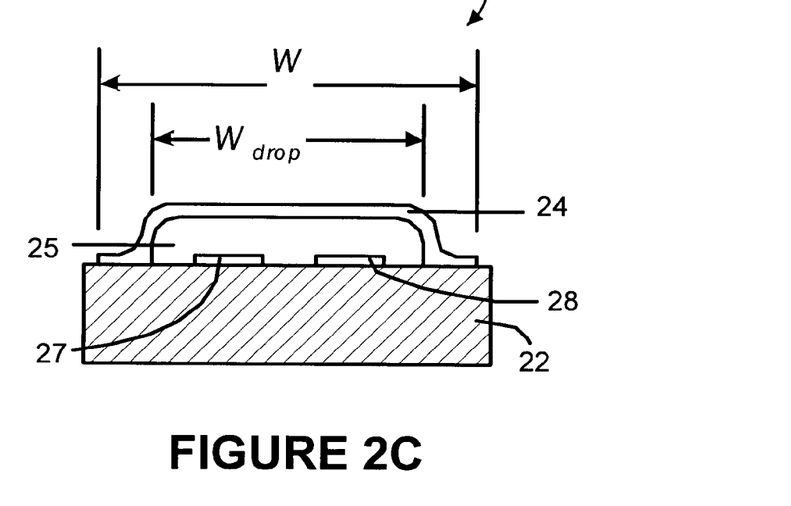
FIG. 2C is a schematic cross sectional view of a transistor according to another alternative embodiment of the invention.

FIG. 2C is a cross section through a transistor 20C that is in the form of a drop on substrate 22. If the width ($W_g$) of gate electrode 24 is bigger than the diameter ($W_{drop}$) of the drop then gate electrode 24 encapsulates the transistor. In such embodiment, gate electrode 24 may seal to substrate 22 around the perimeter of transistor 20C (except where electrical conducting traces cross the perimeter to connect to source and drain electrodes 27 and 28).

Figure 2D:
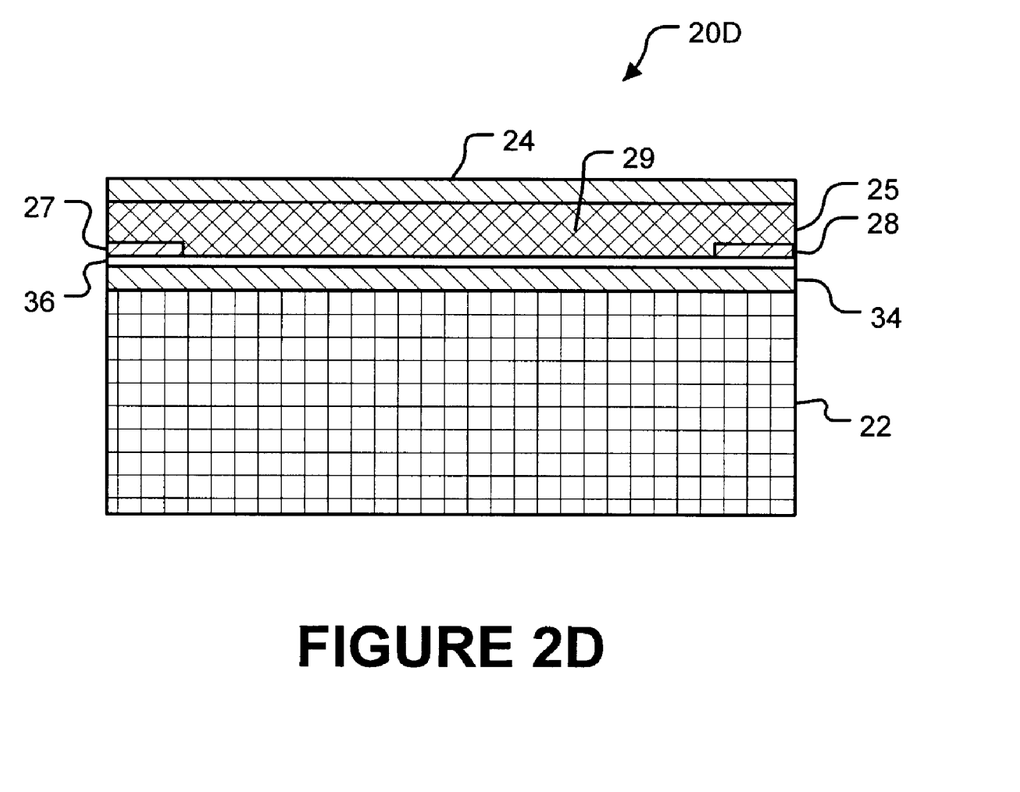
FIG. 2D is a schematic cross sectional view of a transistor according to another alternative embodiment of the invention.

FIG. 2D is a cross section through a transistor 20D that combines structural features of a MESFET and a TFT. Transistor 20D is made on a substrate 22 and has a semiconductor layer 25 having a gate electrode 24 on a first side and source and drain electrodes 27 and 28 on a second side. Transistor 20D differs from transistor 20 in that a second gate electrode 34 and an insulating layer 36 are disposed between substrate 22 and semiconductor layer 25.

Transistor 20D has a number of advantages over a standard thin film transistor. These include:

gate 24 provides encapsulation that protects semiconductor layer 25;

gates 24 and 34 may both be used to increase the gain of the transistor; and, gate 24 depletes the bulk of semiconductor layer 25 and thereby enhances characteristics such as the current on/off ratio when the transistor is used as a TFT (with gate 34 controlling current between source 27 and drain 28).

Where a component (e.g. a layer, electrode, substrate, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. For example:

If substrate 22 or gate electrode 24 are made to be optically transparent (in a transistor 20 like that shown in FIG. 2) then the transistor may be operated as an optical sensor. A transistor 20A like that shown in FIG. 2A may also be operated as an optical sensor.

Accordingly, the scope of the invention is to be construed in accordance with the substance defined by the following claims.

What is claimed is:

1. An active electronic device comprising:
a substrate;
drain and source electrodes making ohmic contact with a layer of a semiconductor, the drain and source electrodes being on a first face of the layer of semiconductor at locations that are spaced apart on either side of a channel in the layer of semiconductor, the first face facing the substrate such that the drain and source electrodes are between the substrate and the semiconductor layer; and,
a gate electrode on a second face of the layer of semiconductor that is opposed to the first face, the gate electrode making a Schottky contact with the layer of semiconductor and overlapping the channel and at least one of the source and drain electrodes.

2. An active electronic device according to claim 1 wherein the gate electrode overlaps both of the source and drain electrodes.

3. An active electronic device according to claim 2 wherein the gate electrode overlaps completely with all of: the source electrode, the drain electrode, and the channel.

4. An active electronic device according to claim 1 wherein the substrate is flexible.

5. An active electronic device according to claim 1 wherein the drain and source electrodes each comprise one or more materials selected from the group consisting of: metals, electrically-conducting polymers, doped semiconductors and carbon nanotubes.

6. An active electronic device according to claim 1 wherein the semiconductor layer comprises a layer of an organic semiconductor.

7. An active electronic device according to claim 1 wherein the semiconductor layer comprises a layer of an amorphous semiconductor.

8. An active electronic device according to claim 1 wherein the semiconductor layer has a thickness greater than a thickness of a Schottky depletion zone at the interface between the gate electrode and the semiconductor layer.

9. An active electronic device according to claim 1 wherein the semiconductor layer has a thickness less than a thickness of a Schottky depletion region at the interface between the gate electrode and the semiconductor layer.

10. An active electronic device according to claim 1 comprising a region of an insulating material on the substrate and surrounding the semiconductor layer, wherein a periphery of the gate electrode extends past an interface between the semiconductor layer and the insulating material.

11. An active electronic device according to claim 1 comprising a second gate electrode between the substrate and the semiconductor layer and an electrically insulating layer between the second gate electrode and the source and drain electrodes.

12. An active electronic device according to claim 1 wherein the semiconductor layer comprises an area bounded by a perimeter wherein the gate electrode covers the entire area of the semiconductor layer.

13. An active electronic device according to claim 1 wherein the channel has a width that is at least five times greater than a thickness of the semiconductor layer.

14. An active electronic device according to claim 1 wherein the semiconductor layer has a thickness that does not exceed 1 µm.

15. An active electronic device according to claim 1 wherein the semiconductor layer has a thickness that is in the range of 30 nm to 300 nm.

16. An active electronic device according to claim 1 wherein the gate electrode comprises one or more of: silver, calcium, cesium, magnesium and aluminum.

17. An active electronic device according to claim 1 wherein the semiconductor layer is made up of a p-type organic semiconductor.

18. An active electronic device according to claim 1 wherein the gate electrode is of a material having a work function not exceeding 3½ eV.

19. An active semiconductor device according to claim 1 wherein the layer of semiconductor is encapsulated between the gate electrode and the substrate.

20. An active electronic device comprising:
a layer of a semiconductor supported on a substrate;
two or more electrodes making ohmic contact with the semiconductor layer; and,
a gate electrode that is electrically insulated from the electrodes;
wherein the semiconductor layer is between the substrate and the gate electrode, the gate electrode covers the semiconductor layer and contacts the substrate around a periphery of the semiconductor layer so as to encapsulate the semiconductor layer between the electrode and the substrate.

21. An active electronic device according to claim 20 wherein the semiconductor layer comprises a layer of an organic semiconductor and the substrate is flexible.

22. An active electronic device according to claim 21 wherein the gate electrode makes a Schottky contact with the layer of semiconductor at least in a channel region of the layer of semiconductor, the channel region lying between first and second ones of the two or more electrodes.

23. An active electronic device comprising:
drain and source electrodes making ohmic contact with a layer of a semiconductor, the drain and source electrodes being on a first face of the semiconductor layer at locations that are spaced apart on either side of a channel in the semiconductor layer;
a first gate electrode on a second face of the semiconductor layer, the second face of the semiconductor layer opposing the first face of the semiconductor layer, the first gate electrode making a Schottky contact with the semiconductor layer;
a second gate electrode located on a first side of the semiconductor layer, the first side of the semiconductor layer corresponding to the first face of the semiconductor layer;
an insulating layer located between the second gate electrode and the drain and source electrodes.

24. An active electronic device according to claim 23 wherein at least one of the first and second gate electrodes spans a region that overlaps the channel and at least one of the source and drain electrodes.

25. An active electronic device according to claim 24 wherein the at least one of the first and second gate electrodes spans a region that overlaps the channel and both of the source and drain electrodes.

26. An active electronic device according to claim 23 wherein at least a portion of the insulating layer is in contact with the channel.

27. An active electronic device according to claim 26 wherein the portion of the insulating layer in contact with the channel spans substantially an entirety of the channel.

28. An active electronic device according to claim 24 wherein another one of the first and second gate electrodes spans a region that is coextensive with the region spanned by the at least one of the first and second gate electrodes on an opposing side of the layer of semiconductor.

* * * * *